US006917900B2

(12) United States Patent
Jones et al.

(10) Patent No.: US 6,917,900 B2
(45) Date of Patent: Jul. 12, 2005

(54) METHOD, APPARATUS AND COMPUTER PROGRAM PRODUCT FOR IMPLEMENTING ENHANCED NOTIFICATION AND CONTROL FEATURES IN OSCILLOSCOPES

(75) Inventors: Steven Paul Jones, Rochester, MN (US); Peter Elias Kubista, West Concord, MN (US); Kerry Paul Pfarr, Rochester, MN (US); Brian Andrew Schuelke, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 74 days.

(21) Appl. No.: 10/660,031

(22) Filed: Sep. 11, 2003

(65) Prior Publication Data

US 2005/0060110 A1 Mar. 17, 2005

(51) Int. Cl.[7] .............................................. G06F 11/30
(52) U.S. Cl. ...................................... 702/188; 702/189
(58) Field of Search ........................... 700/1, 9, 28, 83; 702/188, 189

(56) References Cited

U.S. PATENT DOCUMENTS 4,099,240 A * 7/1978 Rode et al. .................... 702/85
6,560,557 B1 * 5/2003 Carnahan et al. ............ 702/122
2003/0216891 A1 * 11/2003 Wegener ...................... 702/188
2004/0012382 A1 * 1/2004 Fender et al. ............ 324/121 R
2004/0239309 A1 * 12/2004 Barr et al. ............... 324/121 R

FOREIGN PATENT DOCUMENTS

JP          2003-067189     *  3/2003    ............. G06F/9/44

OTHER PUBLICATIONS

Fisher, J; Hoye, W; Koehler, J; Lian, R; Zongli, L; "Development of an access–by–the–internet control laboratory"; IEEE Conference on Decision and Control; vol. 3; Dec. 4–7, 2001; pp 2827–2832.*

* cited by examiner

Primary Examiner—Michael Nghiem
Assistant Examiner—Douglas N. Washburn
(74) Attorney, Agent, or Firm—Joan Pennington

(57) ABSTRACT

A method, apparatus and computer program product are provided for implementing enhanced notification and control features in an oscilloscope. User selected notification options and user selected control options are stored. When a predefined event is identified, the user selected notification options are used for notifying a remote user of the identified predefined event. The user selected control options are used for receiving user selections enabling the user to remotely control oscilloscope operational settings. The user can be notified with a telephone call, an email or a pager text message and the user can change operational settings using a telephone call or an email containing commands.

17 Claims, 5 Drawing Sheets

METHOD, APPARATUS AND COMPUTER PROGRAM PRODUCT FOR IMPLEMENTING ENHANCED NOTIFICATION AND CONTROL FEATURES IN OSCILLOSCOPES

FIELD OF THE INVENTION

The present invention relates generally to the data processing field, and more particularly, relates to a method, apparatus and computer program product for implementing enhanced notification and control features in an oscilloscope.

DESCRIPTION OF THE RELATED ART

As used in the present specification and claims, the term oscilloscope or oscilloscope system should be understood to generally include laboratory test equipment including logic analyzers and oscilloscopes.

For events that occur infrequently in the lab, substantial time often is wasted by the user waiting for the oscilloscope to trigger. This becomes a problem for the engineer who leaves the oscilloscope to get other work done and the scope triggers while he is gone and he does not know that the scope had a trigger event. This can waste time in solving the hardware problem as well.

Some known oscilloscopes include an e-mail transmission function to provide, for example, results, error messages, and measurement data at designated time intervals to a specified e-mail address.

A need exists for an improved oscilloscope system to maximize the productivity time of the engineer. It is desirable to provide such improved oscilloscope system to inform the engineer that the oscilloscope has triggered and capable of providing data and receiving a control input, for example, to enable the user to remotely implement a next step that should be performed to further investigate a particular problem.

SUMMARY OF THE INVENTION

A principal object of the present invention is to provide a method, apparatus and computer program product for implementing enhanced notification and control features in an oscilloscope. Other important objects of the present invention are to provide such method, apparatus and computer program product for implementing enhanced notification and control features substantially without negative effect and that overcome many of the disadvantages of prior art arrangements.

In brief, a method, apparatus and computer program product are provided for implementing enhanced notification and control features in an oscilloscope. User selected notification options and user selected control options are stored. When a predefined event is identified, the user selected notification options are used for notifying a remote user of the identified predefined event. The user selected control options are used for receiving user selections enabling the user to remotely control oscilloscope operational settings.

In accordance with features of the invention, the user can be notified with a telephone call, an email or a pager text message and the user can change operational settings using a telephone call or an email containing commands. The user selected notification options include one or more of a predefined set of user selected telephone, email, and pager options, telephone numbers, email addresses, and a list of predefined items to be sent to the user. The user selected control options includes one or more of a predefined set of telephone commands, a predefined set of email commands, a telephone password, and an email password.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
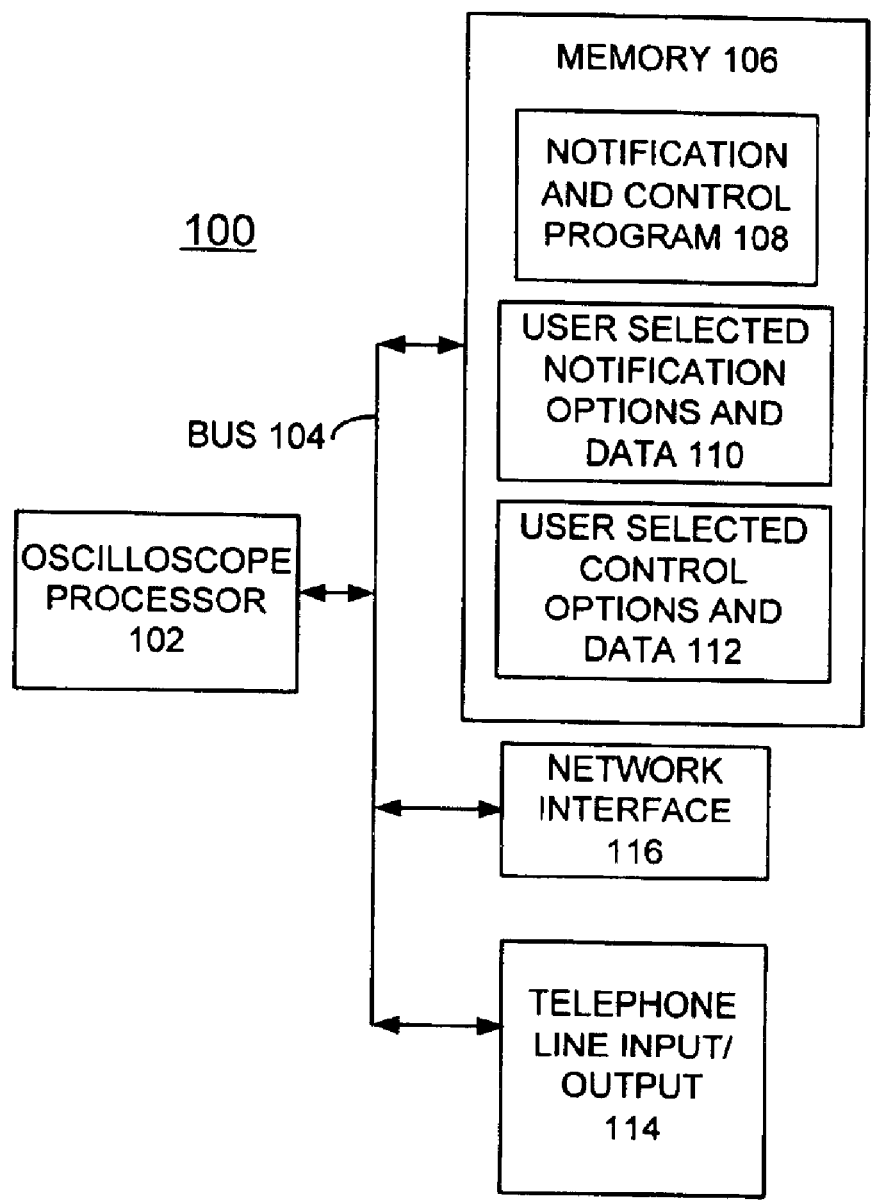
FIG. 1 is block diagram representation illustrating an oscilloscope system for implementing enhanced notification and control features in accordance with the preferred embodiment.

Referring now to the drawings, in FIG. 1 there is shown an oscilloscope system generally designated by the reference character 100 for implementing enhanced notification and control features in accordance with the preferred embodiment. Oscilloscope system 100 includes a processor 102 coupled via a system bus 104 to a memory 106. Memory 106 stores a notification and control program 108 of the preferred embodiment, user selected notification options and data 110 of the preferred embodiment, and user selected control options and data 112 of the preferred embodiment. Oscilloscope system 100 includes a telephone line input/output 114 and a network interface 116 used for communications with a remote user to send and receive messages.

User selected notification options and data 110 stores a predefined set of user selected telephone, email, and pager options, telephone numbers, email addresses, and a list of predefined items to be sent to the user. User selected control options and data 112 stores a predefined set of telephone and email commands, selected by the user, optionally including phone and email passwords to allow for security. In accordance with features of the notification and control program 108 of the preferred embodiment, steps performed by oscilloscope system 100, notifying functions and control options can be changed as desired by the user.

Oscilloscope system 100 is shown in simplified form sufficient for an understanding of the present invention. It should be understood that the present invention is not limited for use with the illustrated system 100. The illustrated oscilloscope system 100 is not intended to imply architectural or functional limitations. The present invention can be used with various hardware implementations and oscilloscope systems and can be implemented using various telephone technology and computer technology to store data, and to send and receive messages.

Figure 2:
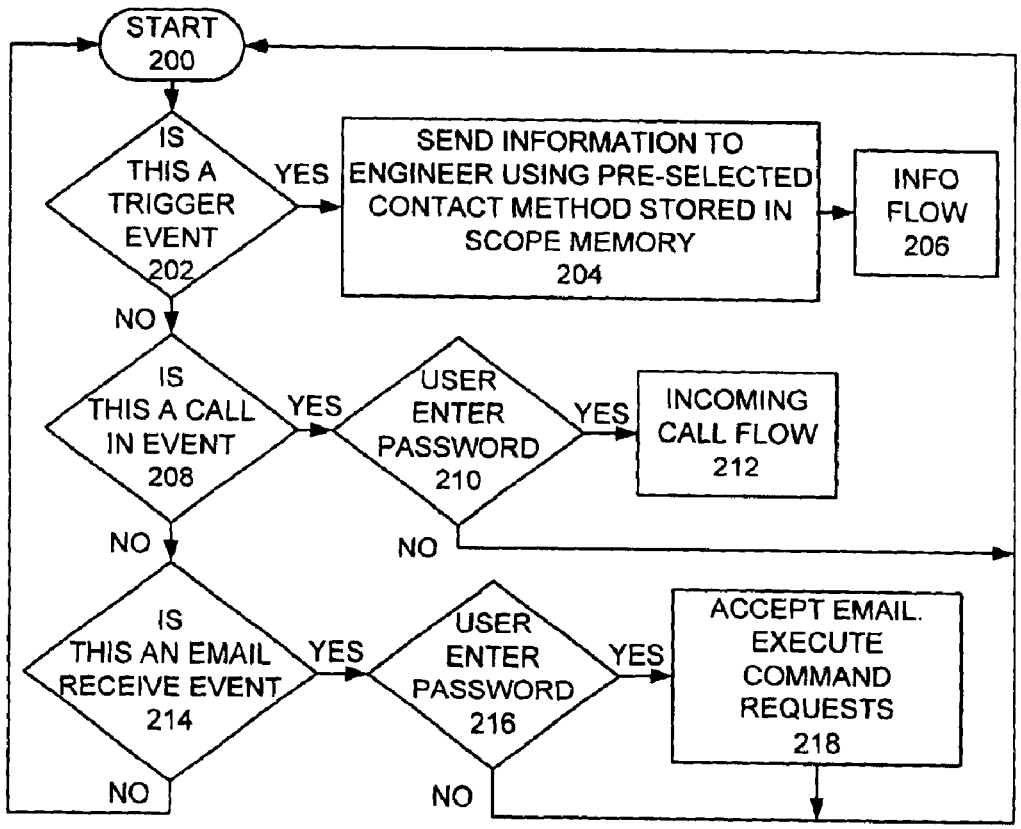
FIGS. 2, 3, and 4 are flow charts illustrating exemplary steps for implementing enhanced notification and control features in accordance with the preferred embodiment.
Figure 3:
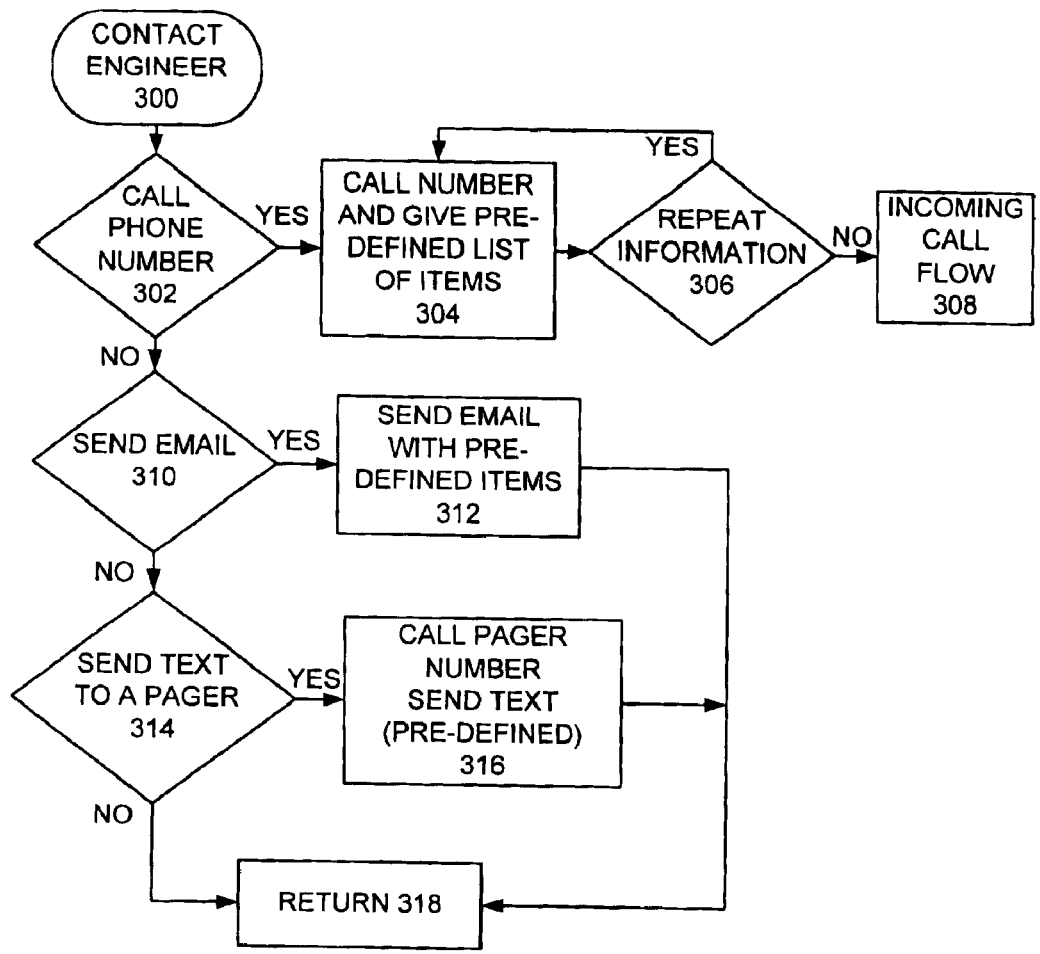
Figure 4:
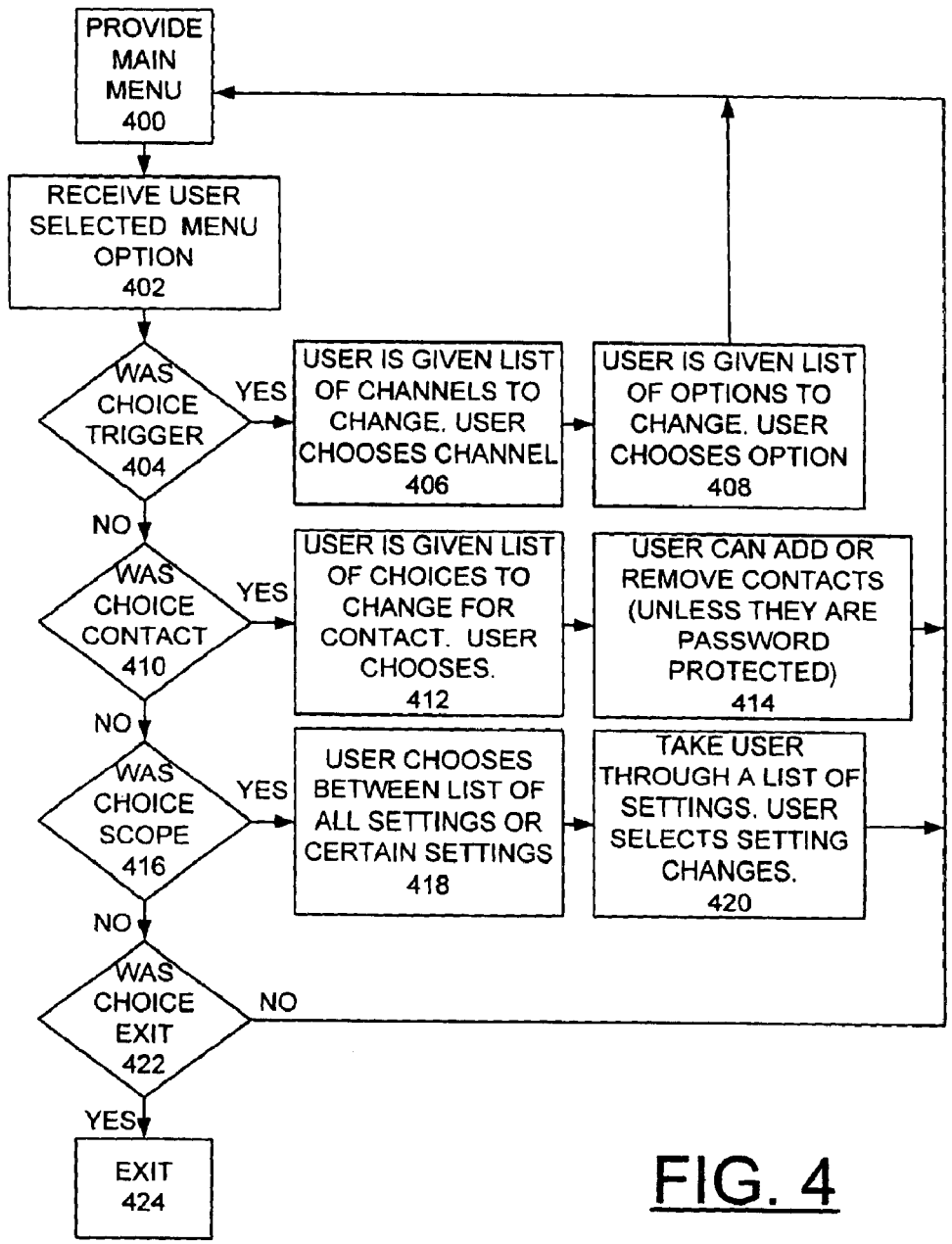

Processor 102 is suitably programmed to perform methods for implementing enhanced notification and control features in accordance with the preferred embodiment, for example, as illustrated and described with respect to FIGS. 2–4. Various commercially available devices can be used for processor 102. For example, processor 102 can be implemented, for example, by one of a line of PowerPC processors manufactured and sold by International Business Machines Corporation.

In accordance with features of the preferred embodiment, enhanced notification and control features are provided for both notifying a user of trigger events and enabling the user to remotely control oscilloscope operational settings. For the case where the oscilloscope triggers and the engineer is not present, the oscilloscope system 100 optionally issues a telephone call to a predefined phone number and lets the engineer know that the oscilloscope had triggered. A picture can be sent to the phone if it is a video telephone. This could also be done using a wireless phone. The oscilloscope system 100 can also send a text message to a pager. Another option is to send a message through the Internet and/or intranet using instant messaging to let the engineer know. The oscilloscope system 100 can look to see if the designated users are logged in. When logged in, an instant message can be sent and if a response is not received in a certain amount of time other messages can be send out through other means.

While there are oscilloscopes that can send out an email, there is significant value to being able to send an email back to the scope to tell it to do something else such as store the current picture, adjust some settings, and re-arm for another event in accordance with features of the notification and control program 108 of the preferred embodiment. The oscilloscope system 100 can be set up to take phone calls and allow the user to enter a password. This can allow the user to re-arm the oscilloscope system 100 remotely where a computer is not available. This could be done through voice recognition or pushbutton codes to store current trace, adjust settings, re-arm, or various other settings.

Advantages of this invention are that it allows the oscilloscope system 100 to notify user when there is not a computer available, for example, by telephone, PDA or pager. The user is enabled to send various forms of instruction, by phone or email, to the oscilloscope system 100 so that the engineer can more efficiently use this time if he is away from the lab and eliminates the need to get back to the lab to re-arm the oscilloscope system.

Referring now to FIG. 2, there are shown exemplary steps performed by processor 102 of oscilloscope system 100 for implementing enhanced notification and control features in accordance with the preferred embodiment starting at a block 200. Checking for a trigger event is performed as indicated in a decision block 202. When a trigger event is identified, then information is sent to the user engineer using a pre-selected contact method stored in memory 106 as indicated in a block 204. An information flow routine, for example, as illustrated and described with respect to FIG. 3, is performed for sending the information as indicated in a block 206.

When a trigger event is not identified, then checking whether this is a call in event is performed as indicated in a decision block 208. When this is a call in event, checking for a user entered password optionally is performed as indicated in a decision block 210. After the optional user entered password is received, then as indicated in a block 212 the incoming call in event or incoming call flow routine is processed, for example, as illustrated and described with respect to FIG. 4. Otherwise, if the user entered password is required by the user setup and is not received, the sequential operations return to block 200 without performing the incoming call flow routine.

When a call in event is not identified, then checking whether this is an email receive event is performed as indicated in a decision block 214. When this is an email receive event, checking for a user entered password optionally is performed as indicated in a decision block 216. Then or after the optional user entered password is received, the incoming email is accepted, and command requests contained in the received email are executed as indicated in a block 218. Otherwise, if the user entered password is required by the user setup and is not received, the sequential operations return to block 200 accepting the email.

Referring now to FIG. 3, there are shown exemplary steps of the information flow routine of block 206 in FIG. 2 starting with contacting the engineer as indicated in a block 300. Checking for a stored telephone number for a user selected telephone notification is performed as indicated in a decision block 302. When a stored telephone number is identified, then the telephone number is called and a message to the user is given including a predefined list of items as indicated in a block 304. The message to the user provides information for a user selected predefined trigger event. The user is given the option to have the information repeated as indicated in a decision block 306. If selected, then the message to the user is repeated at block 304. When the option to have the information repeated is not selected, then the incoming call flow routine of FIG. 4 is performed as indicated in a block 308.

When a user selected telephone notification is not found, then checking for a user selected email notification is performed as indicated in a decision block 310. When the user selected email notification is identified, then the email is sent that includes predefined items of information for the user selected predefined trigger event as indicated in a block 312. When the user selected email notification is not identified, then checking for a user selected pager notification is performed as indicated in a decision block 314. When the user selected pager notification is identified, then the pager is called and a text message is sent that includes predefined items of information for the user selected predefined trigger event as indicated in a block 316. As indicated in a block 318, the sequential operations return to block 200 in FIG. 2.

The exemplary steps for the information flow routine of FIG. 3 illustrate one example for providing information to the user. It should be understood that the present invention is not limited to the exemplary steps for the information flow routine of FIG. 3, for example, notifications can be provided with various combinations of user selected telephone, email and pager notifications.

Referring now to FIG. 4, there are shown exemplary steps of the incoming call flow routine of block 212 in FIG. 2 and block 308 of FIG. 3 starting with presenting a main menu as indicated in a block 400. Main menu options announced to the user at block 400 include, for example, to change trigger options push 1, to change contact list push 2, to ask for scope setting push 3, to exit push 4. Then the user selects a menu option by pushing a selected telephone button as indicated in a block 402.

When the user selected choice was to change trigger options as indicated in a decision block 404, then the user is given a list of channels for selection for the trigger options change and the user selects a particular channel as indicated in a block 406. Then the user is given a list of trigger options to change and the user selects trigger options to change as indicated in a block 408. For example, the user selects trigger options to change at block 408 include, for example, to change trigger level push 1, to change trigger edge push 2, to return to the main menu push 9. After the user selects trigger options to change at block 408, then the sequential operations return to the main menu at block 400.

When the user selected choice was to change contact list options as indicated in a decision block 410, then the user is given a list of contact options for change and the user selects contact options for change as indicated in a block 412. For example, the user selects contact options to change at block 412 include, for example, to change telephone number push 1, to change email list push 2, and to change pager list push 3. Then the user is given options to add or remove contacts and the user selects changes, unless they are password protected and cannot be changed by the user, as indicated in a block 414. After the user selects changes at block 414, then the sequential operations return to the main menu at block 400.

When the user selected choice was to ask for scope setting as indicated in a decision block 416, then the user chooses between a list of all settings or certain settings as indicated in a block 418. For example, the user selects between all settings or certain settings at block 418 include, for example, to select a list of all settings push 1, and to select a list of certain settings push 2. Then the user is given the user selected list of settings and the user selects setting changes as indicated in a block 420. After the user selects changes at block 420, then the sequential operations return to the main menu at block 400.

When the user selected choice was to exit as indicated in a decision block 422, then the sequential operations exit as indicated in a block 422. Otherwise when the choice was not to exit, then the sequential operations return to the main menu at block 400.

The exemplary steps for the incoming call flow routine of FIG. 4 illustrate one example for providing information to the user and receiving user selected changes. It should be understood that the present invention is not limed to the exemplary steps for the incoming call flow routine of FIG. 4, for example, other steps could be provided for enabling the user to remotely control notification settings and oscilloscope operational settings.

Figure 5:
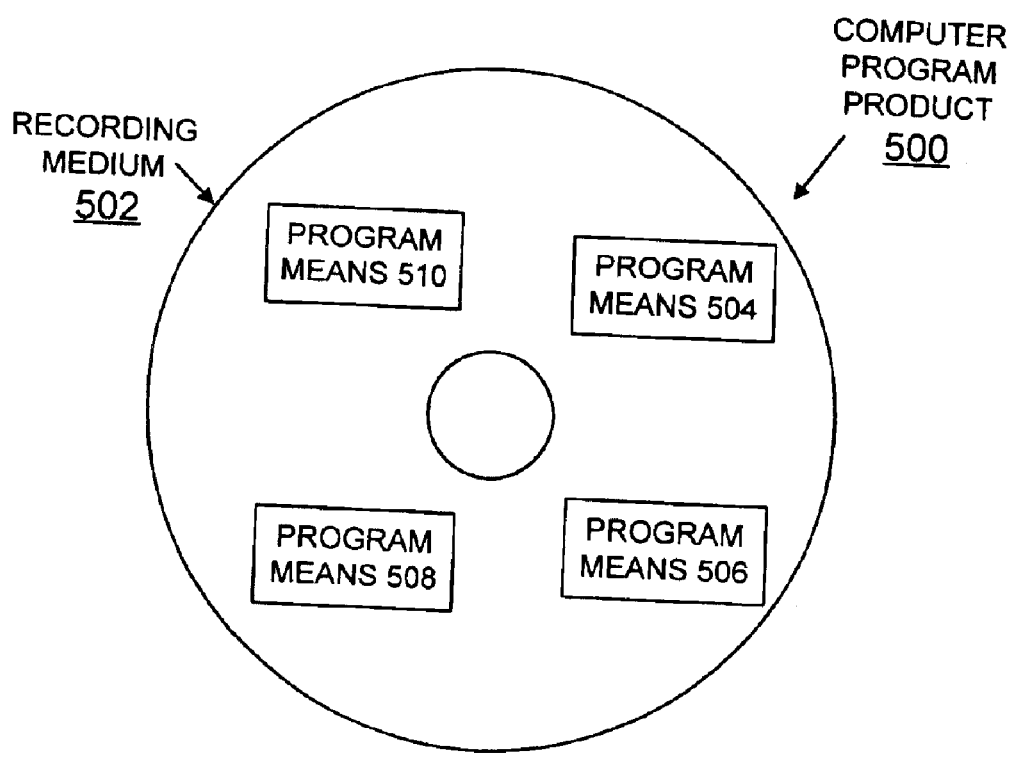
FIG. 5 is a block diagram illustrating a computer program product in accordance with the preferred embodiment.

Referring now to FIG. 5, an article of manufacture or a computer program product 500 of the invention is illustrated. The computer program product 500 includes a recording medium 502, such as, a floppy disk, a high capacity read only memory in the form of an optically read compact disk or CD-ROM, a tape, a transmission type media such as a digital or analog communications link, or a similar computer program product. Recording medium 502 stores program means 504, 506, 508, 510 on the medium 502 for carrying out the methods for implementing enhanced notification and control features of the preferred embodiment in the oscilloscope system 100 of FIG. 1.

A sequence of program instructions or a logical assembly of one or more interrelated modules defined by the recorded program means 504, 506, 508, 510, direct the oscilloscope system 100 for implementing enhanced notification and control features of the preferred embodiment.

While the present invention has been described with reference to the details of the embodiments of the invention shown in the drawing, these details are not intended to limit the scope of the invention as claimed in the appended claims.

What is claimed is:

1. A method for implementing enhanced notification and control features in an oscilloscope comprising the steps of:
   receiving user selected notification options and user selected control options; identifying a predefined event; using said user selected notification options, notifying a remote user of said identified predefined event including identifying a user selected telephone number, calling said user selected telephone number, and giving a message to the user including a predefined list of items; and
   using said user selected control options, receiving user selections for enabling the user to remotely control oscilloscope operational settings.

2. A method for implementing enhanced notification and control features as recited in claim 1 wherein the step of identifying a predefined event includes the step of identifying a user selected trigger event.

3. A method for implementing enhanced notification and control features as recited in claim 1 further includes the steps of identifying a predefined call in event; and using said user selected control options, receiving user selections for enabling the user to remotely control oscilloscope operational settings.

4. A method for implementing enhanced notification and control features as recited in claim 3 includes identifying a user entered password before receiving said user selections for enabling the user to remotely control oscilloscope operational settings.

5. A method for implementing enhanced notification and control features as recited in claim 1 further includes the steps of identifying a predefined email event; accepting said email and using said user selected control options, executing command requests in said email for enabling the user to remotely control oscilloscope operational settings.

6. A method for implementing enhanced notification and control features as recited in claim 1 wherein the step of receiving user selected notification options includes the steps of receiving user selections of one or more of a predefined set of user selected telephone, email, and pager options, telephone numbers, email addresses, and a list of predefined items to be sent to the user.

7. A method for implementing enhanced notification and control features as recited in claim 1 wherein the step of receiving user selected control options includes the steps of receiving user selections of one or more of a predefined set of telephone commands, a predefined set of email commands, a telephone password, and an email password.

8. A method for implementing enhanced notification and control features as recited in claim 1 wherein the step of using said user selected notification options, notifying said remote user of said identified predefined event includes the steps of identifying a user selected email option, sending an email to the user including a predefined list of items.

9. A method for implementing enhanced notification and control features as recited in claim 1 wherein the step of using said user selected notification options, notifying said remote user of said identified predefined event includes the steps of identifying a user selected pager option, calling a user selected pager telephone number, and sending a text message to the user.

10. A method for implementing enhanced notification and control features as recited in claim 1 wherein the step of using said user selected control options, receiving user selections for enabling the user to remotely control oscilloscope operational settings includes the steps of receiving user selections for one or more of a channel selection for the oscilloscope, a trigger level change, and a trigger edge change.

11. A method for implementing enhanced notification and control features as recited in claim 1 wherein the step of using said user selected control options, receiving user selections for enabling the user to remotely control oscilloscope operational settings includes the steps of receiving user selections of contact options to change one or more of a telephone number, an email list, and a pager list.

12. A method for implementing enhanced notification and control features as recited in claim 1 wherein the step of using said user selected control options, receiving user selections for enabling the user to remotely control oscilloscope operational settings includes the steps of receiving user selections to change one or more of a plurality of oscilloscope settings including graphics settings and a list of commands with current settings.

13. A computer program product for implementing enhanced notification and control features in an oscilloscope system, said computer program product including instructions executed by the oscilloscope system to cause the oscilloscope system to perform the steps of:

receiving user selected notification options and user selected control options;

identifying a predefined event;

using said user selected notification options, notifying a remote user of said identified predefined event;

using said user selected control options, receiving user selections for enabling the user to remotely control oscilloscope operational settings; and identifying a predefined email event; and using said user selected control options, executing command requests in said email for enabling the user to remotely control oscilloscope operational settings.

14. A computer program product for implementing enhanced notification and control features in an oscilloscope system as recited in claim 13 wherein said instructions executed by the oscilloscope system further cause the oscilloscope system to perform the steps of identifying a predefined call in event; and using said user selected control options, receiving user selections for enabling the user to remotely control oscilloscope operational settings.

15. Apparatus for implementing enhanced notification and control features in an oscilloscope comprising:

memory for storing a notification and control program, user selected notification options and notification data and user selected control options and control data; said user selected notification options and notification data including one or more of a predefined set of user selected telephone, email, and pager options, telephone numbers, email addresses, and a list of predefined items to be sent to the user;

a processor operatively controlled by said notification and control program for identifying a predefined event; using said user selected notification options and notification data, for notifying a remote user of said identified predefined event; and using said user selected control options and control data, for receiving user selections for enabling the user to remotely control oscilloscope operational settings.

16. Apparatus for implementing enhanced notification and control features in an oscilloscope as recited in claim 15 wherein said user selected control options and control data includes one or more of a predefined set of telephone commands, a predefined set of email commands, a telephone password, and an email password.

17. Apparatus for implementing enhanced notification and control features in an oscilloscope as recited in claim 15 wherein said processor for receiving user selections for enabling the user to remotely control oscilloscope operational settings includes said processor for receiving user selections for one or more contact options to change one or more of a telephone number, an email list, and a pager list; said processor for receiving user selections for one or more oscilloscope options to change one or more of a plurality of oscilloscope settings including graphics settings and a list of commands with current settings; and said processor for receiving user selections for one or more trigger options to change one or more of an oscilloscope channel, a trigger level, and a trigger edge.

\* \* \* \* \*